(12) United States Patent
Hoffmann et al.

(10) Patent No.: US 7,452,764 B2
(45) Date of Patent: Nov. 18, 2008

(54) GATE-INDUCED STRAIN FOR MOS PERFORMANCE IMPROVEMENT

(75) Inventors: Thomas Hoffmann, Hillsboro, OR (US); Stephen M. Cea, Hillsboro, OR (US); Martin D. Giles, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/070,365

(22) Filed: Mar. 1, 2005

(65) Prior Publication Data

US 2005/0167652 A1 Aug. 4, 2005

Related U.S. Application Data

(62) Division of application No. 10/459,998, filed on Jun. 12, 2003, now Pat. No. 6,982,433.

(51) Int. Cl.
*H01L 21/8238* (2006.01)
(52) U.S. Cl. ............ 438/199; 438/301; 257/E21.632
(58) Field of Classification Search ......... 438/199, 438/301, 938, 197, 303; 257/E21.632
See application file for complete search history.

(56) References Cited

U.S. PATENT DOCUMENTS

| | | | |
|---|---|---|---|
| 5,128,739 A * | 7/1992 | Shirato | ......... 257/351 |
| 5,906,708 A | 5/1999 | Robinson et al. | |
| 5,963,817 A | 10/1999 | Chu et al. | |
| 6,242,327 B1 | 6/2001 | Yokoyama et al. | |
| 6,294,797 B1 * | 9/2001 | Wu | ......... 257/67 |
| 6,335,233 B1 | 1/2002 | Cho et al. | |
| 6,365,472 B1 | 4/2002 | Ishimaru et al. | |
| 6,395,621 B1 | 5/2002 | Mizushima et al. | |
| 6,455,364 B1 | 9/2002 | Asai et al. | |
| 6,455,871 B1 | 9/2002 | Shim et al. | |
| 6,465,283 B1 | 10/2002 | Chang et al. | |
| 6,492,216 B1 | 12/2002 | Yeo et al. | |
| 6,573,172 B1 | 6/2003 | En et al. | |
| 2002/0052084 A1 | 5/2002 | Fitzgerald | |
| 2002/0081861 A1 | 6/2002 | Robinson et al. | |
| 2002/0086503 A1 | 7/2002 | Schuegraf et al. | |
| 2002/0140031 A1 | 10/2002 | Rim | |
| 2003/0040158 A1 * | 2/2003 | Saitoh | ......... 438/279 |

(Continued)

FOREIGN PATENT DOCUMENTS

JP 402218164 A * 8/1990

(Continued)

OTHER PUBLICATIONS

PCT Notification of Transmittal of the International Search Report and the Written Opinion of the International Search Authority, or the Declaration, Oct. 26, 2004.

(Continued)

*Primary Examiner*—Hoai V Pham
(74) *Attorney, Agent, or Firm*—Blakely, Sokoloff, Taylor & Zafman LLP (57) ABSTRACT

A method including forming a device on a substrate, the device including a gate electrode on a surface of the substrate; a first junction region and a second junction region in the substrate adjacent the gate electrode; and depositing a straining layer on the gate electrode.

6 Claims, 6 Drawing Sheets

U.S. PATENT DOCUMENTS

2004/0075148 A1   4/2004   Kumagai et al.

FOREIGN PATENT DOCUMENTS

JP    07202178       12/1993
JP    2003-86708 A    3/2003

OTHER PUBLICATIONS

Ota, K., et al., "Novel locally strained channel technique for high performance 55nm CMOS," International Electro Devices Meeting, 2002, pp. 27-30.

Office Action for Chinese Application No. CN200410048245.8 dated Sep. 22, 2006 and English translation thereof (18 pages).

Hui, Q I, et al., "$Si_{1-x-y}Ge_xC_y$ Alloy Semiconductor Technology and Its Applications," Microelectronics, vol. 33, No. 2, Apr. 2003 (pp. 127-131).

Office Action for EP Application No. 04755988.5 dated Apr. 23, 2007 (5 pages).

* cited by examiner

GATE-INDUCED STRAIN FOR MOS PERFORMANCE IMPROVEMENT

CROSS-REFERENCE TO RELATED APPLICATION

The application is a Divisional of U.S. patent application Ser. No. 10/459,998, filed Jun. 12, 2003, now U.S. Pat. No. 6,982,433 and incorporated herein by reference.

FIELD

Circuit devices and the manufacture and structure of circuit devices.

BACKGROUND

Increased performance of circuit devices on a substrate (e.g., integrated circuit (IC) transistors, resistors, capacitors, etc. on a semiconductor (e.g., silicon) substrate) is usually a major factor considered during design, manufacture, and operation of those devices. For example, during design and manufacture or forming of, metal oxide semiconductor (MOS) transistor semiconductor devices, such as those used in a complementary metal oxide semiconductor (CMOS), it is often desired to increase movement of electrons in N-type MOS device (NMOS) channels and to increase movement of positive charged holes in P-type MOS device (PMOS) channels.

U.S. Pat. No. 6,335,233 discloses a first conductive impurity ion that is implanted into a semiconductor substrate to form a well area on which a gate electrode is formed. A first non-conductive impurity is implanted into the well area on both sides of the gate electrode to control a substrate defect therein and to form a first precipitate area to a first depth. A second conductive impurity ion is implanted into the well area on both sides of the gate electrode, so that a source/drain area is formed to a second depth being relatively shallower than the first depth. A second non-conductive impurity is implanted into the source/drain area so as to control a substrate defect therein and to form a second precipitate area.

U.S. Pat. No. 6,365,472 discloses a semiconductor device that includes a lightly doped drain (LDD) structure MOS transistor wherein the formation of defects due to ion implantation at the edge of the side wall of the gate electrode is suppressed. In order to perform the ion implantation for forming the source and drain regions of the MOS transistor, impurity ions are implanted using the first and second side walls provided to the gate electrode as a mask, and then the heat treatment for impurity activation is performed after removing the second side wall near the source and drain regions doped with high-concentration impurity ions. By removing the second side wall prior to the heat treatment, the stress applied to the edges of the high-concentration impurity doped regions in an amorphous state is decreased.

U.S. Pat. No. 6,455,364 discloses a method for fabricating a semiconductor device in which, a collector layer of a first conductivity type is formed in a region of a semiconductor substrate sandwiched by device isolation. A collector opening is formed through a first insulating layer deposited on the semiconductor substrate so that the range of the collector opening covers the collector layer and part of the device isolation. A semiconductor layer of a second conductivity type as an external base is formed on a portion of the semiconductor substrate located inside the collector opening, while junction leak prevention layers of the same conductivity type as the external base are formed in the semiconductor substrate.

U.S. Pat. No. 6,455,871 discloses a method for fabricating a SiGe device using a metal oxide film. There is disclosed growing a silicon buffer layer and a SiGe buffer layer on a silicon substrate by low-temperature process, so that defects caused by the mismatch of the lattice constants being applied to the epitaxial layer from the silicon substrate are constrained in the buffer layered formed by the low-temperature process.

U.S. Patent Application Publication Number 2002/0140031 discloses a strained silicon on insulator (SOI) structure and a method for its fabrication, in which a strained silicon layer lies directly on an insulator layer, contrary to the prior requirement for strained-Si layers to lie directly on a strain-inducing (e.g., SiGe) layer. The method generally entails the forming a silicon layer on a strain-inducing layer so as to form a multilayer structure, in which the strain-inducing layer has a different lattice constant than silicon so that the silicon layer is strained as a result of the lattice mismatch with the strain-inducing layer. The multilayer structure is then bonded to a substrate so that an insulating layer is between the strained silicon layer and the substrate, and so that the strained silicon layer directly contacts the insulating layer. The strain-inducing layer is then removed to expose a surface of the strained silicon layer and yield a strained silicon-on-insulator structure that comprises the substrate, the insulating layer on the substrate, and the strained silicon layer on the insulating layer.

BRIEF DESCRIPTION OF THE DRAWINGS

Various features, aspects, and advantages will become more thoroughly apparent from the following detailed description, appended claims, and accompanying drawings in which:

DETAILED DESCRIPTION

Figure 1:
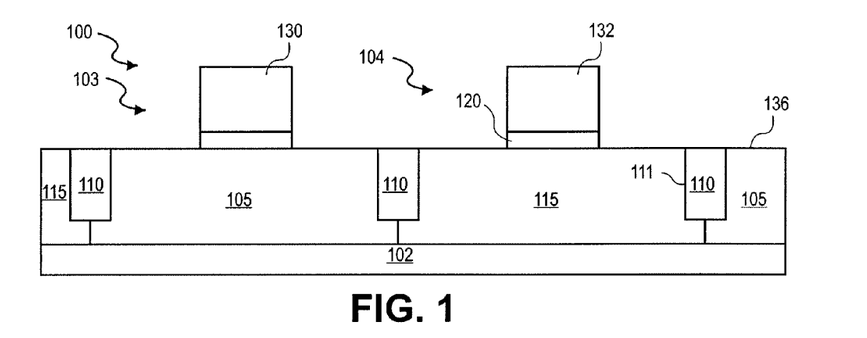
FIG. 1 is a schematic cross-sectional view of a portion of a semiconductor substrate after forming a well, gate dielectric, and gate electrode of NMOS and PMOS devices.

FIG. 1 is a cross-sectional view of a portion of a semiconductor substrate after forming a well, gate dielectric, and gate electrode of an NMOS device and a PMOS device. Apparatus 100 (e.g., such as one or more CMOS structures) includes semiconductor substrate 102, in one embodiment a silicon substrate, or epitaxial layer of a semiconductor substrate, having active areas or cell regions defined by isolation areas such as shallow trench isolation structures 110 formed in substrate or epitaxial layer 102. For example, substrate 102 may be formed or grown from single crystal silicon, and shallow trench isolation (STI) structures 110 may be formed by defining regions (through trench etching) and growing or depositing silicon dioxide ($SiO_2$) dielectric in the trench openings (e.g., such as formed to height H 111 as shown in FIG. 1). In another embodiment, STI structures 110 define active areas or cell regions for individual transistor devices (e.g., such as NMOS and PMOS devices of a CMOS structure).

FIG. 1 includes P-type well 105 and N-type well 115 formed in the individual active area or cell region defined by STI structures 110. For example, P-type well 105 is formed in one region of substrate 102 while N-type well 115 is formed in a second region of substrate 102. P-type well 105 is formed, such as, by introducing a dopant, such as boron (B) and/or indium (In), into an area of substrate 102 designated for an N-type device. N-type well 115 is formed, such as, by introducing a dopant, such as arsenic (As), phosphorous (P), and/or antimony (Sb) in an area of substrate 102 designated for a P-type device. P-type well 105 and N-type well 115 may have work functions corresponding to the work function of an NMOS device and PMOS device, respectively, of a CMOS circuit.

FIG. 1 illustrates substrate 102 after the forming a gate dielectric layer and gate electrode layer over the surface 136 of substrate 102, and subsequent patterning or removal of unwanted portions of the gate dielectric layer and/or gate electrode layer. For instance, as shown, gate dielectric 120 may be grown or deposited. An example of a suitable gate dielectric material that is typically grown by thermal techniques over substrate 102 is $SiO_2$. It is to be appreciated that, in addition to $SiO_2$, other gate dielectrics, such as silicon nitride ($Si_3N_4$), or aluminum oxide ($Al_2O_3$) may be used to further optimize the CMOS transistor devices. For example, gate dielectric materials having a high dielectric constant may be used, if desired, for example, to increase the capacitance of the gate.

FIG. 1 shows a structure which includes gate electrodes 130 and 132 over the surface of substrate 102, such as by deposition onto gate dielectric 120. NMOS gate electrode 130 and PMOS gate electrode 132 may each be deposited to a thickness of, for example, about 150 to about 2000 angstroms (e.g., 15-200 nanometers (nm)). Accordingly, the thickness of NMOS gate electrode 130 and PMOS gate electrode 132 are each scalable and may be selected or chosen based on integration issues related to device performance. NMOS gate electrode 130 has a work function corresponding to the work function of an N-type device. PMOS gate electrode 132 has a work function corresponding to the work function of a P-type device. In another embodiment, NMOS gate electrode 130 and PMOS gate electrode 132 may be silicon deposited by chemical vapor deposition (CVD) and then doped to form N-type and P-type materials, respectively, such as by doping as described above with respect to forming the N-type and P-type material of N-type well 115 and P-type well 105, respectively. For instance, NMOS gate electrode 130 may be doped at the same time that the corresponding NMOS junction regions are doped (e.g., such as NMOS junction regions 203, shown in FIG. 2), and PMOS gate electrode 132 may be doped at the same time the PMOS junction regions are doped (e.g., such as PMOS junction regions 204, shown in FIG. 2)

FIG. 1 further shows the substrate after removal of undesired portions of gate dielectric 120 and NMOS gate electrode 130 and PMOS gate electrode 132, such as by patterning a mask over a defined area for NMOS gate electrode 130 and PMOS gate electrode 132 and etching away the undesired exposed portions not covered by the mask. For example, undesired portions of gate dielectric 120 and one or more types of gate electrode material may be patterned to form gate dielectric 120 and NMOS gate electrode 130 over NMOS device 103, and to form gate dielectric 120 and PMOS electrode 132 over PMOS device 104, such as by patterning using conventional techniques, such as plasma etchant, sputter etchant, and/or a chlorine-based etch chemistry. In another embodiment, NMOS gate electrode 130 and PMOS gate electrode 132 may be polysilicon deposited by CVD and then masked and etched.

Figure 2:
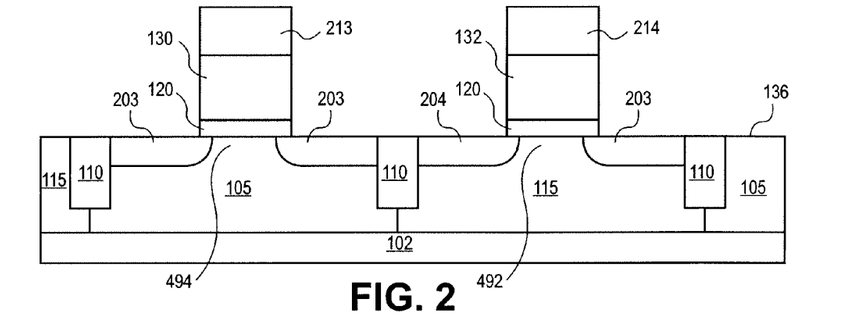
FIG. 2 shows a semiconductor substrate after forming straining layers on the NMOS and PMOS devices.

FIG. 2 shows the semiconductor substrate of FIG. 1 after forming straining layers and junction regions of the NMOS and PMOS devices. FIG. 2 shows NMOS straining layer 213 and PMOS straining layer 214 that may be formed, of a suitable material having a lattice spacing different than NMOS gate electrode 130 and PMOS gate electrode 132, respectively, to strain the individual electrodes and/or channel regions of the transistor devices. For example, NMOS straining layer 213 may be formed by depositing a material on NMOS gate electrode 130, in one embodiment, epitaxially, where NMOS straining layer 213 has a lattice spacing greater than NMOS gate electrode 130. NMOS straining layer 213 may be formed by patterning and etching the formed or deposited material.

Similarly, PMOS straining layer 214 may be formed by depositing a material on PMOS gate electrode 132, in one embodiment, epitaxially, where PMOS straining layer 214 has a lattice spacing less than PMOS gate electrode 132. PMOS straining layer 214 may be formed by patterning and etching the formed or deposited material. It is contemplated that NMOS straining layer 213 may be a different material than PMOS straining layer 214.

FIG. 2 illustrates NMOS junction regions 203 and PMOS junction regions 204 (e.g., also referred to as "source-drain regions" or "diffusion regions") that may be formed by a junction implant (e.g., such as implanting with arsenic, phosphorous, and/or antimony for N-type junction regions 203 and boron and/or indium for P-type junction regions 204) and possibly include additionally corresponding type tip implants. In one embodiment, NMOS junction regions 203 may be formed by doping portions of P-type well 105 to form those junction regions. In another embodiment, NMOS junction regions 203 may be formed, in accordance with the characteristics of an NMOS device, by doping the material of P-type well 105, to form the N-type material in NMOS junction regions 203, as described above with respect to doping to form the N-type material of N-type well 115. In another embodiment, PMOS junction regions 204 may be formed, by doping portions of N-type well 115 to form those junction regions. In another embodiment, portions of N-type well 115 may be doped to form the P-type material in PMOS junction regions 204, in accordance with the characteristics of a PMOS device, by doping as described with respect to doping to form the P-type material of P-type well 105.

Junction formation is generally known in the art. In one embodiment, junction regions 203 and 204 may be formed prior to deposition of straining layers 213 and 214. In another embodiment, straining layers 213 and 214 maybe formed prior to the formation of junction regions 203 and 204.

In another embodiment, formation of NMOS straining layer 213, PMOS straining layer 214, NMOS junction regions 203, and/or PMOS junction regions 204 may occur in any order as appropriate, such as in accordance with the characteristics of the desired device.

FIG. 2 illustrates NMOS channel 494, and PMOS channel 492. In one embodiment, NMOS channel's 494 performance is increased by placing NMOS channel 494 in tensile strain. In another embodiment, PMOS channel's 492 performance is increased by placing PMOS channel 492 in compressive strain. In one embodiment, straining layer 213 places NMOS gate electrode 130 and NMOS channel 494 in tensile strain. In another embodiment, straining layer 214 places PMOS electrode 132 and PMOS channel 492 in compressive strain.

Figure 3:
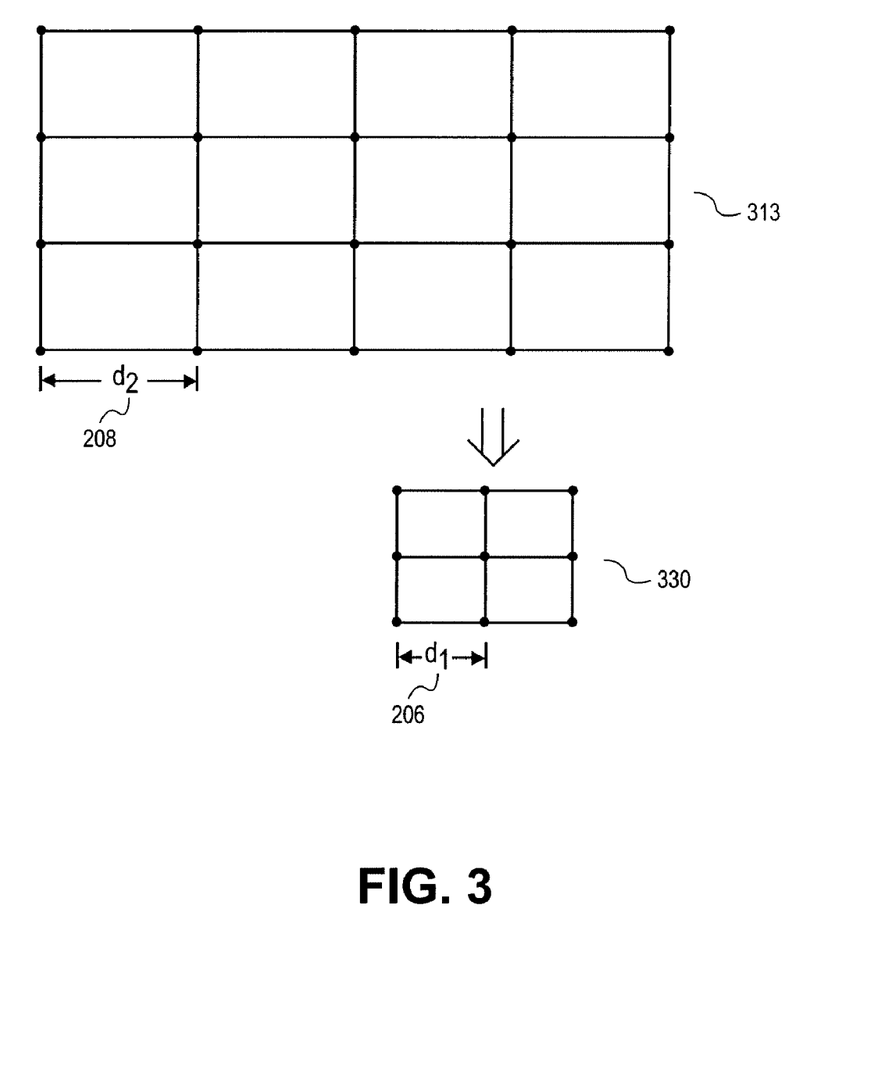
FIG. 3 shows a small lattice spacing gate electrode and a straining layer.

FIG. 3 illustrates straining layer 313 and gate electrode 330. Straining layer 313 has a lattice spacing $d_2$ 208, while gate electrode 330 has a lattice spacing $d_1$ 206. As illustrated, straining layer 313 has lattice spacing $d_2$ 208 that is larger than gate electrode 330 which has lattice spacing $d_1$ 206.

Figure 4:
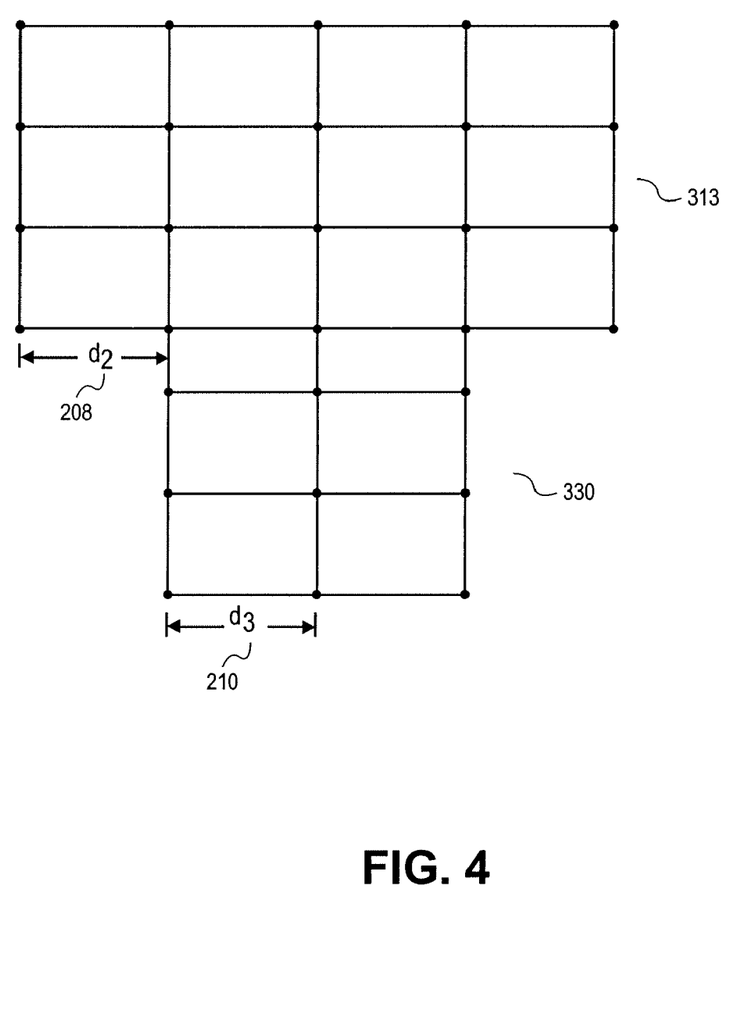
FIG. 4 shows a strained small lattice spacing gate electrode.

Referring now to FIG. 4, straining layer 313 has been brought into contact with gate electrode 330, such that the lattice of gate electrode 330 has matched to the lattice of straining layer 313. As illustrated, the lattice spacing of straining layer 313 has decreased slightly to $d_2$ 208 while gate electrode 330 has had its lattice spacing $d_1$ 206 increased substantially to $d_3$ 210. The amount that lattice spacing $d_2$ 208 will increase, and that lattice spacing $d_1$ 206 will increase is dependent on the relative thicknesses of gate electrode 330 and straining layer 313. If straining layer 313 is relatively thicker or more massive than gate electrode 330, then $d_2$ 208 will hardly decrease at all, while $d_1$ 206 will increase substantially. Alternatively, if straining layer 313 is relatively thinner or less massive than gate electrode 330, then $d_1$ 206 will hardly increase at all, and $d_2$ 208 will decrease substantially.

As illustrated in FIGS. 3 and 4, $d_2$ 208 has decreased slightly from FIGS. 3-4, while the lattice spacing for gate electrode 330 has increased from $d_1$ 206 in FIG. 3 to $d_3$ 210 in FIG. 4.

The strain placed on the lattice of gate electrode 204 equals:

$$E = \frac{d_1 - d_3}{d_1} \times 100\%$$

In one embodiment, the strain is less than about 10%. In another embodiment, the strain is less than about 5%. In another embodiment, the strain is less than about 2%. In another embodiment, the strain is less than about 1%.

In one embodiment, gate electrode 330 is silicon, and straining layer 313 is a material having lattice spacing $d_2$ 208 between about 0.5% and about 10% larger than silicon. In one embodiment, if lattice spacing $d_2$ 208 is more than about 10% larger than lattice spacing $d_1$ 206, then gate electrode 330 may experience significant dislocations when gate electrode 330 is brought into contact with straining layer 313 as illustrated in FIG. 4.

In another embodiment, gate electrode 330 as shown in FIG. 3 has a lattice spacing between about 0.5 and about 0.6 nm, and straining layer 313 has a larger lattice spacing than gate electrode 330 of about 0.51 to about 0.61 nm.

In one embodiment, straining layer 313 may be made of silicon doped with an element having a covalent radius larger than silicon, which would cause the lattice spacing of the silicon to increase. Suitable dopants include one or more of aluminum (Al), galium (Ga), germanium (Ge), arsenic (As), indium (In), tin (Sn), antimony (Sb), thalium (Tl), lead (Pb), and/or bismuth (Bi). The amounts of the dopants may be adjusted in order to compensate for the relative size of silicon compared to the various dopants. In one embodiment, silicon has a covalent radius of 1.11 Å, aluminum has a covalent radius of 1.18 Å, and antimony has a covalent radius of 1.40 Å. Since the covalent radius of aluminum is relatively close to the covalent radius of silicon, adding 1% of aluminum will not have a large effect on the lattice spacing of the silicon. In contrast, adding 1% of antimony to silicon will have a larger effect than adding 1% of aluminum to silicon, since the covalent radius of antimony is much larger than the covalent radius of silicon.

For example, a large amount of aluminum is needed to dope silicon compared to a very small amount of antimony in order to achieve the same lattice spacing. In another embodiment, suitable dopants include arsenic (As), antimony (Sb), and/or bismuth (Bi).

In another embodiment, channel (not shown) may be provided adjacent to gate electrode 330, where channel (not shown) may also be strained by straining layer 313. In one embodiment, channel (not shown) defines an interior of the apparatus, gate electrode 330 is exterior to channel, and straining layer 313 is exterior to gate electrode 330 and channel.

Figure 5:
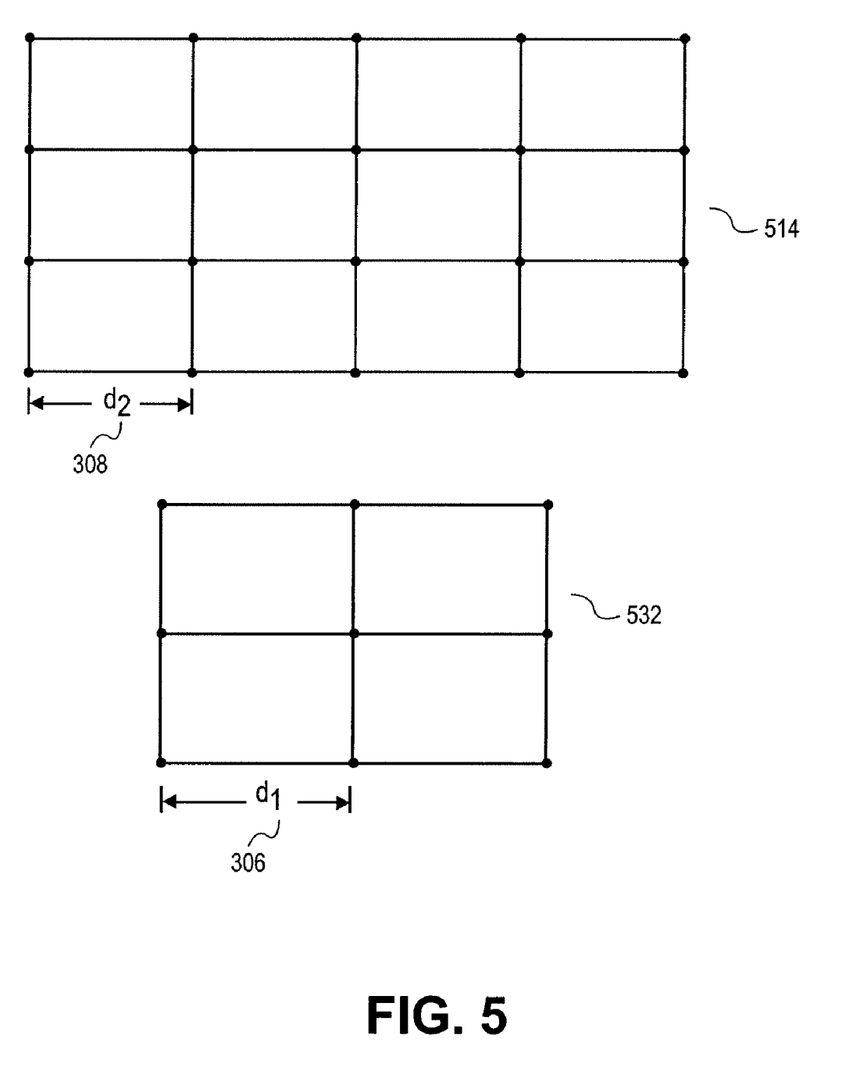
FIG. 5 shows a large lattice spacing gate electrode and a straining layer.

Referring now to FIG. 5, there is illustrated gate electrode 532 having lattice spacing $d_1$ 306, and straining layer 514 having lattice spacing $d_2$ 308. As shown in FIG. 5, lattice spacing $d_1$ 306 of gate electrode 532 is larger than lattice spacing $d_2$ 308 of straining layer 514.

Figure 6:
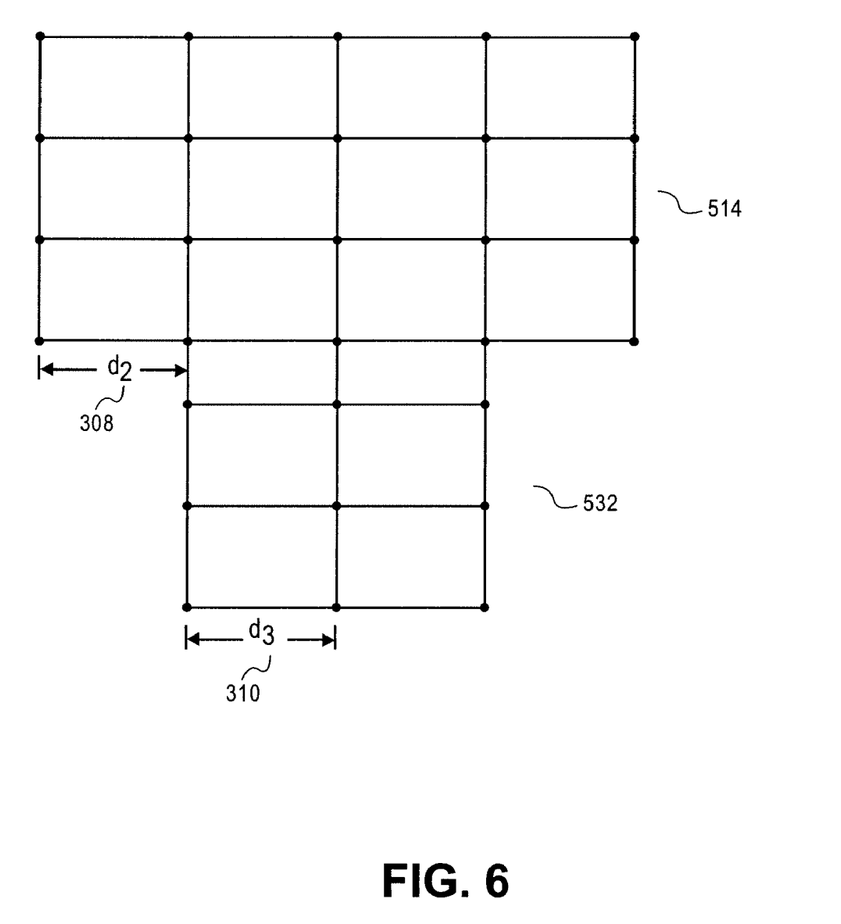
FIG. 6 shows a strained large lattice spacing gate electrode.

Referring now to FIG. 6, straining layer 514 has been brought into contact with gate electrode 532 so that the lattice of gate electrode 532 aligns with the lattice of straining layer 514. Lattice spacing $d_2$ 308 of straining layer 514 has slightly increased from FIG. 5 to FIG. 6, while lattice spacing $d_1$ 306 of gate electrode 532 has been greatly reduced from $d_1$ 306 in FIG. 5 to $d_3$ 310 in FIG. 6. Similar to the discussion above regarding FIG. 4, the relative amount that d1 306 will be decreased and that d2 308 will be increased depends on the relative sizes and/or masses of gate electrode 532 and straining layer 514. The larger the relative size and/or mass of straining layer 514 as compared to gate electrode 532, the lesser amount that d2 308 will increase, and the greater amount that d1 306 will decrease.

In one embodiment, gate electrode 532 is silicon, and straining layer 514 is a material having a lattice spacing less than silicon. In one embodiment, suitable materials for straining layer 514 include silicon doped with an element having a covalent radius less than the covalent radius of silicon. Adding an element with a smaller covalent radius than silicon will tend to decrease the lattice spacing of silicon. The smaller the covalent radius of the element as compared to silicon, the larger the effect that element will have on the lattice spacing of the silicon. For example, if silicon has a covalent radius of 1.11 Å, phosphorous has a covalent radius of 1.06 Å, and boron has a covalent radius of 0.82 Å. Adding 1% boron to silicon will make the lattice spacing smaller than adding 1% of phosphorous to silicon, since boron has a smaller covalent radius.

In another embodiment, suitable dopants to add to silicon include one or more of boron (B), carbon (C), nitrogen (N), and/or phosphorous (P). As discussed above regarding FIG. 3 and FIG. 4, in order to obtain a given lattice spacing for straining layer 514, less boron would be needed as a dopant for silicon than phosphorous, given their relative covalent radii. Since phosphorous has a covalent radius much closer in size to silicon, it will not affect Silicon's lattice size as much as boron, therefore, more phosphorous would be needed to obtain a given lattice sizing. In another embodiment, suitable materials for straining layer 514 include an alloy of silicon and boron (B).

In one embodiment, the strain experienced by gate electrode 532 from FIG. 5 to FIG. 6 is defined as:

$$E = \frac{d_1 - d_3}{d_1} \times 100\%$$

In one embodiment, strain is less than about 10%. In another embodiment, strain is less than about 5%. In another embodiment, strain is less than about 2%. In another embodiment, strain is less than about 1%.

In one embodiment, if strain is greater than about 10%, then there may be significant lattice dislocations in gate electrode 532 when brought into contact with straining layer 514.

In another embodiment, gate electrode 532 has a lattice spacing of between about 0.3 nm and 0.6 nm, and straining layer 514 has a smaller lattice spacing of between about 0.49 nm and about 0.59 nm.

In another embodiment, channel (not shown) may be located adjacent to electrode 532. Channel (not shown) may also be strained by straining layer 514. In one embodiment, channel (not shown) defines an interior of the apparatus, gate electrode 532 is exterior to channel, and straining layer 514 is exterior to gate electrode 532 and channel.

In one embodiment, gate electrodes 330 and/or 532, have a thickness substantially less than straining layers 313 and/or 514. In another embodiment, straining layers 313 and/or 514 have a thickness of about ten times greater than gate electrodes 330 and/or 532.

Referring now to FIG. 2, in one embodiment, NMOS straining layer 213 comprises silicon germanium (SiGe) (for example, about 20% to about 60% germanium) and NMOS electrode 130 and/or channel 494 comprise silicon (Si). In another embodiment, PMOS straining layer 214 comprises carbon-doped silicon, for example, carbon-doped silicon having about 1% carbon and about 99% silicon, and PMOS electrode 132 and/or channel 492 comprise silicon (Si).

In another embodiment, NMOS straining layer 213 comprises a first material having a first lattice spacing, and NMOS electrode 130 and/or channel 494 comprise a second material having a second lattice spacing, where the first lattice spacing is larger than the second lattice spacing. In one embodiment, the first lattice spacing is between about 0.2% and about 2% larger than the second lattice spacing.

In another embodiment, PMOS straining layer 214 comprises a first material having a first lattice spacing, and PMOS electrode 132 and/or channel 492 comprise a second material having a second lattice spacing, where the first lattice spacing is smaller than the second lattice spacing. In one embodiment, the first lattice spacing is between about 0.2% and about 2% smaller than the second lattice spacing.

In another embodiment, suitable materials that may be used for electrodes 130 and/or 132, channels 494 and/or 492, and/or straining layers 213 and/or 214 include one or more of the following: silicon (Si), silicon germanium (SiGe), silicon carbide (SiC), nickel silicide (NiSi), titanium silicide (TiSi$_2$), cobalt silicide (CoSi$_2$), and may optionally be doped with one or more of boron and/or indium. For example, electrode 130 and channel 494 include materials having a lattice spacing that are different than the lattice spacing of the straining layer 213. More specifically, in operation, PMOS straining layer 214 has, in one embodiment, a smaller lattice spacing than PMOS gate electrode 132 and/or channel 492 and may cause a compressive strain in gate electrode 132 and/or channel 492. This strain is caused by PMOS gate electrode 132 and PMOS channel 492 having a lattice spacing that is a larger lattice spacing than the lattice spacing of PMOS straining layer 214.

In another embodiment, straining layers may operate by way of thermal mismatch. For example, straining layer 213 may have a coefficient of linear thermal expansion that is less than the coefficient of linear thermal expansion of gate electrode 130. When gate electrode 130 and straining layer 213 are deposited at an elevated temperature, for example, about 500° C. to about 700° C., there is no strain. However, as gate electrode 130 and straining layer 213 cool, gate electrode 130 will try to shrink more than straining layer 213, since gate electrode 130 has a larger coefficient of linear thermal expansion than straining layer 213. This mismatch in coefficients will cause a tensile strain in gate electrode and a compressive strain in straining layer. The relative amounts of the compressive and tensile strains will depend upon the relative thicknesses and/or masses of gate electrode 130 and straining layer 213. If straining layer 213 is much thicker than gate electrode 130, then strain on straining layer 213 will be relatively small, while tensile strain on gate electrode 130 will be relatively large. Channel 494 may also be strained.

In operation, gate electrode 130 may be silicon having a coefficient of linear thermal expansion of about 2.6×10−6/° C., and straining layer 213 may be formed of a silicon oxide, having a lesser coefficient of linear thermal expansion of about 0.5×10−6/° C. When silicon oxide straining layer 213 is deposited on silicon gate electrode 130 at an elevated temperature, for example, about 800° C., there is no strain between the layers. When silicon oxide straining layer 213 and silicon gate electrode 130 are cooled to room temperature (of about 25° C.), silicon oxide straining layer 213 will want to shrink less than silicon gate electrode 130 due to silicon oxide's lower coefficient of linear thermal expansion. This will cause a tensile strain in silicon gate electrode 130 and/or channel 494, and a compressive strain in silicon oxide straining layer 213.

In another embodiment, gate electrode 132 may have a lower coefficient of thermal expansion than straining layer 214 to cause a compressive strain in gate electrode 132 and/or channel 492, and a tensile strain in straining layer 214.

In operation, gate electrode 132 may be silicon having a coefficient of linear thermal expansion of about 2.6×10−6/° C., and straining layer 214 may be, for example, aluminum having a higher coefficient of linear thermal expansion of about 23×10−6/° C. When aluminum straining layer 214 is deposited on silicon gate electrode 132 at an elevated temperature, for example, about 500° C., there is no strain between the layers. As the layers cool to room temperature, (for example, about 25° C.), silicon gate electrode 132 wants to shrink less than aluminum straining layer 214. This relative mismatch between the coefficients of linear thermal expansion causes a compressive strain in gate electrode 132 and/or channel 492, and a tensile strain in aluminum straining layer 214.

In another embodiment, the tensile strain in gate electrode 130 may cause a tensile strain in channel 494. In another embodiment, the compressive strain in gate electrode 132 may cause a compressive strain in channel 492.

In another embodiment, strain may be caused by a straining layer having an intrinsic stress. For example, straining layer 213 may be formed of a material having an intrinsic tensile stress within the material, for example a silicon nitride. When straining layer 213 is deposited on gate electrode, it may cause a compressive strain in gate electrode 130. In another embodiment, straining layer 214 may be a material having an intrinsic compressive stress, for example silicon oxide, which when straining layer 214 is deposited on gate electrode 132 may cause a tensile strain within gate electrode 132. Examples of materials having intrinsic stress include nitrides and oxides, which may cause a strain in gate electrodes 130 and/or 132 and/or channels 494 and/or 492. Typically, nitrides may have an intrinsic tensile strain, and oxides may have an intrinsic compressive strain, however, a nitride could have a compressive strain, or an oxide could have a tensile strain, by various treatments known in the art.

In another embodiment, gate electrode 130 and straining layer 213 may be deposited as the same material, then straining layer 213 may be doped with a material to cause straining layer to increase in size. For example, straining layer 213 and gate electrode 130 may be deposited as silicon, then straining layer 213 may be doped with one or more of aluminum, galium germanium, arsenic, indium, tin, and/or antimony. This doping and optionally subsequent heat and/or annealing treatment may cause the lattice size of straining layer 213 to increase, which will cause a tensile strain in gate electrode 130 and/or channel 494.

In another embodiment, gate electrode 132 and straining layer 214 may be deposited as the same material, for example, silicon. Subsequently, straining layer 214 may be doped with one or more of boron, carbon, nitrogen, and/or phosphorous. This doping and optional heat and/or annealing treatment will cause the lattice spacing of straining layer 214 to decrease, which will cause a compressive strain in gate electrode 132 and/or channel 492.

In another embodiment, gate electrode 132 is silicon, and straining layer 214 is carbon-doped silicon, with a transition layer (not shown) between gate electrode 132 and straining layer 214 of having a gradually increasing percentage of carbon, to ease the growth of the carbon-doped silicon onto silicon gate electrode 132.

In another embodiment, electrodes 130 and/or 132 and/or straining layers 213 and/or 214 may be formed or deposited by selective deposition, CVD deposition, and/or epitaxial deposition. For example, an epitaxial layer of single crystal semiconductor film may be formed upon a single crystal substrate, where the epitaxial layer has the same crystallographic characteristics as the substrate material, but differs in type or concentration of dopant. In another embodiment, electrodes 130 and/or 132 and/or straining layers 213 and/or 214 may be formed by selective CVD deposition, and possibly include epitaxial deposition of single crystal silicon alloy with the same crystal structure as that of the material onto which the structure is deposited (e.g., a similar or the same crystal orientation, such as 100, 110, etc.).

In another embodiment, a layer of $Si_{1-x}Ge_x$ may be grown on top of a substrate of Si such that the silicon germanium has a bulk relaxed lattice constant that is larger (e.g., such as by about 0.5 to about 2 percent) than the silicon it is grown on. The resulting lattice misfits at the block or blocks where the silicon germanium bonds to the silicon may create a strain. In other words, a strain, such as a compressive strain, may result from the silicon lattice stretched to fit into the lattice of the silicon-germanium.

Suitable processes for forming or growing of silicon and silicon alloy materials include vapor phase (VPE), liquid phase (LPE), or solid phase (SPE) blocks of silicon processing. For example, one such CVD process that is applicable to VPE of silicon includes: (1) transporting reactants to the substrate surface; (2) reactants absorbed on the substrate surface; (3) chemical reaction on the surface leading to formation of a film and reaction products; (4) reaction products deabsorbed from the surface; and (5) transportation away of the reaction product from the surface.

In addition, suitable forming of silicon and silicon alloys comprises selective epitaxial deposition, formation, or growth known in the art as Type 1 selective epitaxial deposition. Using Type 1 deposition, silicon alloy deposition would be occurring only on gate material(s) within the openings of the oxide film, and minimal, if any, growth on the oxide.

Suitable selective epitaxial formation also includes Type 2 selective epitaxial deposition where selectivity of deposition is non-critical. Using Type 2 deposition, formation or growth of the silicon alloy occurs on gate material(s), as well as on the oxide film, and thus when this type of deposition is made, an interface between the epitaxial layer of silicon alloy formed on the gate material(s) and a polysilicon layer of silicon alloy formed on the oxide film is created. The angle of this interface relative to the film growth direction depends on the crystallographic orientation of the substrate.

In another embodiment, Type 1 selective epitaxial deposition using a silicon source including one or more of the following: silicon, silicon germanium (SiGe), silicon carbide (SiC), nickel silicide (NiSi), titanium silicide ($TiSi_2$), cobalt silicide ($CoSi_2$) at suitable temperatures. Also, $SiH_2Cl_2$, $SiH_4$ may be used as a silicon source if hydrogen chloride (HCl), chlorine ($Cl_2$) is present.

Figure 7:
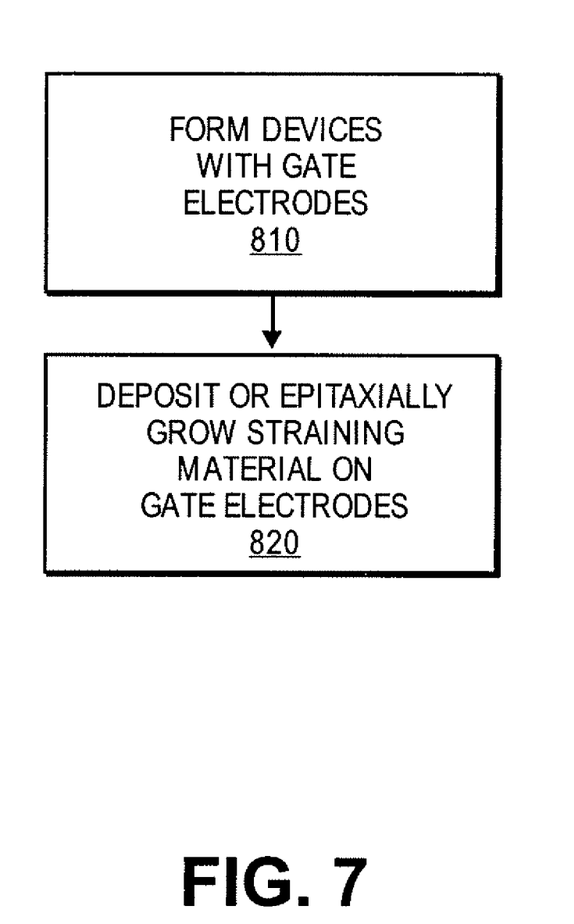
FIG. 7 is a flow diagram of a process for forming a CMOS structure having a device with a straining layer deposited over the electrode.

FIG. 7 is a flow diagram of a process for forming a CMOS structure having a PMOS and/or an NMOS device with a straining layer deposited on at least one gate electrode such that the straining layer imparts a strain to at least one of the electrode and the channel. At 810, NMOS and/or PMOS devices of a CMOS structure are formed on a substrate having the appropriate wells, junction regions, gate dielectrics, gate electrodes, and straining layer. At 820, a straining material is deposited over at least one gate electrode.

Suitable straining materials include, for example, silicon, silicon germanium, doped silicon germanium, silicon carbide, silicon carbon, carbon doped silicon with lattice spacing different from the electrode, which can be deposited by an operation using one or more of CVD, epitaxial deposition, and/or selective deposition. Thus, for an NMOS device, a straining material having a lattice spacing larger than that of the NMOS electrode can be deposited to provide a tensile strain in the NMOS electrode and/or the NMOS channel.

On the other hand, for a PMOS device, a straining material having a lattice spacing that is smaller than the PMOS electrode (e.g., such as, for example, boron-doped silicon, carbon-doped silicon, nitrogen-doped silicon, and/or phosphorous-doped silicon) can be deposited onto a PMOS electrode to cause a compressive strain in the PMOS electrode and/or in the channel of the PMOS device.

Although FIGS. 1-7 describe formation of a CMOS structure having an NMOS device and PMOS device therein, other embodiments include formation of a PMOS and/or NMOS device portion without the other PMOS and/or NMOS device. Thus, contemplated formation of independent single NMOS or PMOS devices, single NMOS or PMOS devices coupled to form a device other than a CMOS structure, multiple coupled PMOS devices, or other appropriate circuit devices on a substrate where the description above with respect to straining material formed or disposed on and electrode such that the electrode is strained are contemplated.

Various embodiments are described above. It will, however, be evident that various modifications and changes may be made thereto without departing from the broader spirit and scope of the claimed subject matter. The specification and drawings are, accordingly, to be regarded in an illustrative rather than a restrictive sense.

What is claimed:

1. A method comprising:
   forming a device on a substrate, the device including a gate electrode on a surface of the substrate and a first junction region and a second junction region in the substrate adjacent the gate electrode;
   forming tip implants adjacent to the first junction region and the second junction region, wherein the tip implants (i) are formed within the substrate, (ii) are situated beneath the gate electrode, and (iii) extend past a sidewall of the gate electrode;

forming a straining layer on the gate electrode, the straining layer patterned to correspond with a dimension of the gate electrode; and controlling a thickness of the straining layer relative to a thickness of the gate electrode such that a strain placed on a lattice of the gate electrode is less than ten percent.

2. The method of claim 1, wherein forming the straining layer comprises forming the straining layer of a different lattice spacing than a lattice spacing of the gate electrode to cause a strain in the substrate.

3. The method of claim 1, wherein forming the straining layer comprises a chemical vapor deposition sufficient to form an epitaxial layer of a straining material.

4. The method of claim 1, wherein the straining layer comprises silicon doped with an element comprising a covalent radius larger than silicon.

5. The method of claim 1, wherein forming a straining layer comprises doping a portion of a material of the gate electrode.

6. The method of claim 1, wherein the straining layer comprises a material having a coefficient of linear thermal expansion that is different than a coefficient of linear thermal expansion of a material of the gate electrode.

* * * * *